(12) United States Patent
Djordjevic et al.

(10) Patent No.: US 9,742,526 B2
(45) Date of Patent: Aug. 22, 2017

(54) OPTIMAL SIGNAL CONSTELLATION DESIGN FOR ULTRA-HIGH-SPEED OPTICAL TRANSPORT IN THE PRESENCE OF PHASE NOISE

(71) Applicant: NEC Laboratories America, Inc., Princeton, NJ (US)

(72) Inventors: Ivan Djordjevic, Tucson, AZ (US); Ting Wang, West Windsor, NJ (US)

(73) Assignee: NEC Corporation, Tokyo (JP)

( * ) Notice: Subject to any disclaimer, the term of this patent is extended or adjusted under 35 U.S.C. 154(b) by 86 days.

(21) Appl. No.: 14/504,428

(22) Filed: Oct. 2, 2014

(65) Prior Publication Data

US 2015/0104197 A1    Apr. 16, 2015

Related U.S. Application Data (60) Provisional application No. 61/890,452, filed on Oct. 14, 2013.

(51) Int. Cl.

| | |
|---|---|
| *H04B 10/11* | (2013.01) |
| *H04L 1/00* | (2006.01) |
| *H04B 10/516* | (2013.01) |
| *H04B 10/61* | (2013.01) |
| *H03M 13/00* | (2006.01) |
| *H04L 27/34* | (2006.01) |

(52) U.S. Cl.
CPC .......... *H04L 1/0041* (2013.01); *H03M 13/00* (2013.01); *H04B 10/516* (2013.01); *H04B 10/6163* (2013.01); *H04L 1/005* (2013.01); *H04L 1/0058* (2013.01); *H04L 27/3405* (2013.01)

(58) Field of Classification Search
CPC  H03M 13/255; H03M 13/00; H04B 10/2507; H04B 10/616; H04B 10/50; H04B 10/516; H04B 10/6163; H04B 10/6165; H04L 25/03171; H04L 27/186; H04L 1/005; H04L 1/0058; H04L 1/0041; H04L 27/3405

USPC .......................................... 398/194; 375/265
IPC ......... G06F 11/10; H03M 13/00; H04B 10/50, 10/2507; H04L 1/00
See application file for complete search history.

(56) References Cited

U.S. PATENT DOCUMENTS

| | | | | |
|---|---|---|---|---|
| 9,036,992 | B2* | 5/2015 | Djordjevic | ........... H04B 10/616 398/149 |
| 2008/0163025 | A1* | 7/2008 | Djordjevic | ............. H03M 13/11 714/755 |
| 2008/0294968 | A1* | 11/2008 | Djordjevic | ......... H03M 13/1111 714/801 |
| 2014/0205283 | A1* | 7/2014 | Djordjevic | ......... H04B 10/2581 398/44 |
| 2016/0105243 | A1* | 4/2016 | Wang | .................. H03M 13/255 398/184 |

\* cited by examiner

*Primary Examiner* — Tesfaldet Bocure
(74) *Attorney, Agent, or Firm* — Joseph Kolodka (57) ABSTRACT

A method to process applicable to coherent optical channels with either linear or nonlinear phase noise includes: splitting a received sequence of data into clusters of points according to a cumulative log-likelihood function from constellation obtained in a previous iteration; generating new constellation points by calculating a center of mass of the clusters of points; repeating until convergence or until a predetermined number of iterations has been reached to determine a signal constellation; and transmitting signals over the coherent optical channels with nonlinear phase noise using the disclosed signal constellation and LDPC-coded modulation concepts.

19 Claims, 5 Drawing Sheets

OPTIMAL SIGNAL CONSTELLATION DESIGN FOR ULTRA-HIGH-SPEED OPTICAL TRANSPORT IN THE PRESENCE OF PHASE NOISE

This application claims priority to Provisional Application 61/890,452 filed Oct. 14, 2013, the content of which is incorporated by reference.

To aid in the understanding of the present discussion the following acronyms are defined beforehand as follows: LDPC—low density parity check, IPQ—iterative polar quantization, CIPQ—centered iterative polar quantization, ASE—amplified spontaneous emission, MAP—maximum a posteriori probability, ML—maximum likelihood, QAM—quadrature amplitude modulation, DSP—digital signal processing, SMF—single mode fiber, FMF—few mode fiber, BER—bit error rate.

BACKGROUND

As a response to never ending high bandwidth demands, the IEEE has ratified its 40/100 Gb/s Ethernet Standard IEEE 802.3ba in June 2010. The deployment of 100 Gb/s Ethernet (GbE) has already started and it is expected to accelerate in next few years. At these ultra-high data rates, the performance of fiber-optic communication systems is degraded significantly due to presence of various linear and nonlinear impairments. To deal with those channel impairments novel advanced techniques in modulation and detection, coding and signal processing have been intensively studied. For carrier phase estimation (CPE), the algorithmic DSP-based approaches are highly popular, and can be categorized into two broad categories data-aided and non-data-aided. The MAP and ML approaches are particularly efficient in CPE; however, the complexity of such algorithms grows exponentially with the channel memory. Even upon compensation of chromatic dispersion and nonlinearity phase compensation there will be some residual phase error. It has been experimentally verified that even in beyond 100 Gb/s transmission the distribution of samples upon compensation of linear and nonlinear impairments is still Gaussian-like with the residual phase error that can properly be modeled as a Markov process.

SUMMARY

In one aspect, a method to process coherent optical channels with nonlinear phase noise includes: splitting a received sequence of data into clusters of points according to a cumulative log-likelihood function from constellation obtained in a previous iteration; generating new constellation points by calculating a center of mass of the clusters of points; repeating until convergence or until a predetermined number of iterations has been reached to determine a signal constellation; and transmitting signals over the coherent optical channels with nonlinear phase noise using the signal constellation.

In another aspect, a signal constellation design method is disclosed which is applicable to coherent detection systems with residual phase error introduced by imperfect carrier phase estimator. Instead of using the Euclidian distance as optimization criterion that is optimum only for additive white Gaussian noise (AWGN) channel, the system defines a cumulative log-likelihood function and uses it as an optimization criterion instead. The optimization criterion is applicable to scenarios in which either linear or nonlinear phase noise dominates. The optimum source distribution is obtained by maximizing the channel capacity, based on Arimoto-Blahut algorithm. The process can be considered as a generalization of the optimum signal constellation design (OSCD) method. Since the method uses the cumulative log-likelihood function as the optimization criterion, based on log-likelihood ratio (LLR) calculation, it has been named here LLR-based OSCD (LLR-OSCD) method. We also disclose an LDPC coded modulation scheme suitable for use in combination with constellations obtained by LLR-OSCD method, which is suitable for use in situations when residual phase error is present in receiver. This LDPC coded modulation scheme represents the generalization of scheme. Monte Carlo simulations indicate that the LDPC-coded modulation schemes based on signal constellations obtained by algorithm significantly outperform the corresponding LDPC-coded QAM.

Advantages of the preferred embodiments may include one or more of the following. The optimum signal constellation design algorithm, named LLR-OSCD, is suitable for receiver operating in the presence of residual linear/nonlinear phase noise. The method employs the cumulative log-likelihood function as an optimization criterion. The method is applicable to both the channels with linear and nonlinear phase noise, and can easily be generalized to other channels. The LDPC-coded constellations show better robustness to the residual phase noise compared to the conventional QAM-based schemes. The code-modulation scheme, employing signal constellations from LLR-OSCD, is robust to laser phase noise, imperfect CPE, and nonlinear phase noise introduced by fiber nonlinearities. The method is robust to cyclic slips. The Monte Carlo integration method to use to calculate the symbol likelihoods in the presence of residual phase error. The method is applicable to both 2-D and multidimensional signaling schemes. The optimized modulation schemes, when used in combination with LDPC coding, are more robust in the presence of phase error than conventional LDPC-coded QAM. The method can also be used in both SMF and FMF applications.

DESCRIPTION

A new signal constellation design algorithm applicable to coherent detection systems with residual phase error introduced by imperfect carrier phase estimator is disclosed. The cumulative log-likelihood function is defined and used as an optimization criterion. The optimization criterion is applicable to scenarios in which either linear or nonlinear phase noise dominates. It can straightforwardly be generalized to other scenarios. The optimum source distribution is obtained by maximizing the channel capacity, based on Arimoto-Blahut algorithm. We also disclosed an LDPC coded modulation scheme suitable for use in combination with constellations obtained by LLR-OSCD algorithm, which is suitable for use in situations when residual phase error is present in receiver. The LDPC-coded LLR-OSCD modulation schemes show much better robustness to phase noise compared to traditional LDPC-coded QAM.

Optimal Signal Constellation Design for Linear Phase Noise Channel

In the presence of phase noise, instead of minimizing the mean square error, we define the cumulative log-likelihood function and get the optimal signal constellation that maximizes this function. Namely, the Euclidean distance receiver is optimum only for the AWGN channel. The starting point in the algorithm is to use the conventional Arimoto-Blahut algorithm to determine the optimum source distribution for the phase noise channel, and then generate the constellation samples from this source. Then we run the LLR-OSCD method. After initialization (for example, conventional QAM constellation and CIPQ constellation can be used for initialization), we split the received sequence into clusters of points according to the cumulative log-likelihood function from constellation obtained in previous iteration. New constellation points are generated by calculating the center of mass of such obtained clusters. This procedure is repeated until convergence or until a predetermined number of iterations has been reached.

The LLR-OSCD method can be formulated as follows.

Initialization: Choose the signal constellation that will be used for initialization. Let the size of constellation be M.

Generate the training sequence from the optimum source distribution. Denote this sequence as $\{x_j; j=0, \ldots, n-1\}$.

Group the samples from this sequence into M clusters. The membership to the cluster is determined based on LLR of sample point and candidate signal constellation points from previous iteration. Each sample point is assigned to the cluster with the largest LLR. Given the m-th subset (cluster) with N candidate constellation points, denoted as $\hat{A}_m = \{y_i; i=1, \ldots, N\}$, find the likelihood function (LL) of partition $P(\hat{A}_m) = \{S_i; i=1, \ldots, N\}$, as follows $$LL_m = LL(\{\hat{A}_m, P(\hat{A}_m)\}) = n^{-1} \sum_{k=0}^{n-1} \max_{y \in \hat{A}_m} LL(x_k, y) \quad (1)$$

The function $LL(x_j, y)$ is the cumulative log-likelihood function defined as $$LL(x_k, y) = \frac{1}{NS} \sum_{i=1}^{NS} -\frac{\{x_{k1} - \mathrm{Re}[(y_1 + y_2 j)e^{-j \times PN_i}]\}^2 + \{x_{k2} - \mathrm{Im}[(y_1 + y_2 j)e^{-j \times PN_i}]\}^2}{2\delta^2} \quad (2)$$

Where NS denotes the number of phase noise samples and the corresponding phase noise sample is denoted as $PN_i$. $x_{k1}$ and $x_{k2}$ denote the first and second coordinates of the point $x_k$. Similarly, $y_1$ and $y_2$ denote the coordinates of the point y. The equation above is applicable to two-dimensional (2D) signal constellation design, but it can straightforwardly be generalized for arbitrary dimensionality.

Determine the new signal constellation points as center of mass for each cluster.

Repeat the steps 2)-3) until convergence.

Figure 1A:
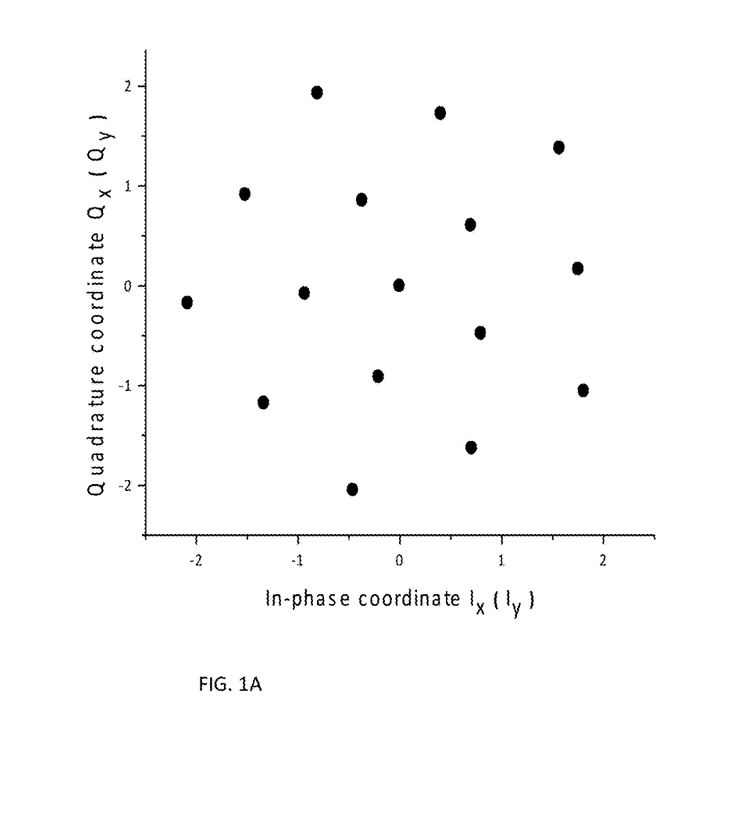
FIG. 1A shows exemplary optimized 2D 16-ary signal constellations for a 16-ary LLR-OSCD.
Figure 1B:
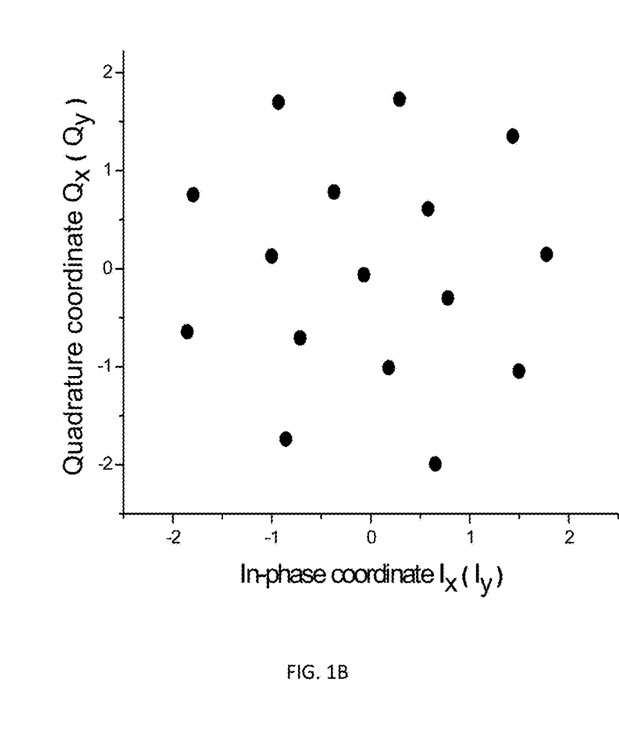
FIG. 1B show exemplary optimized 2D 16-ary signal constellations for a 16-ary OSCD.

This process is applicable to both linear and nonlinear phase noise channels. As an illustration, FIG. 1(a) shows the 16-ary LLR-OSCD 2D constellation and FIG. 1(b) shows the 16-ary OSCD 2D constellation for comparison. The results are obtained for phase noise and ASE noise dominated scenario, by setting the frequency offset×symbol duration product to $10^{-3}$.

Notice that the OSCD constellation is optimal for ASE noise dominated channel 91. The optimal source for OSCD is Gaussian distribution and the criterion for determining the membership for cluster is Euclidean distance squared. It is obvious that the result has three layers (central point is an individual layer) and has the circle shape. However, the constellation obtained by LLR-OSCD algorithm is optimized for the channel affected by phase noise and ASE noise simultaneously. By having the pentagon-like shape at outer layer and moving one constellation point from inner layer to the pentagon layer, the 16-ary LLR-OSCD can deal better.

LDPC Coded Modulation Scheme Employing the LLR-OSCDs

The equivalent phase noise channel model, we mentioned above, is briefly described below. The Wiener phase noise model can be used to describe the laser phase noise and imperfect carrier phase estimation (CPE), which is $$\theta_k = (\theta_{k-1} + \Delta\theta_k) \bmod 2\pi \quad (3)$$

where $\theta_k$ denotes the residual phase error (at kth time instance) and $\Delta\theta_k$ denotes the zero-mean Gaussian process of variance $\delta_{\Delta\theta} = 2\pi\Delta f T_s$, in which $T_s$ is symbol duration and $\Delta f$ denotes the linewidth or frequency offset. We can also model the cyclic slips by Markvo-like process of certain memory. The resulting noise process is Gaussian-like distribution and the corresponding PDF is given by $$p(r | a_k, \theta_k) = e^{-\frac{\|r_k - s(a_k, \theta_k)\|^2}{N_0}} / (\pi N_0) \quad (4)$$

where $s(a_k, \theta_k) = e^{j\theta_k}[a_k^1, a_k^2, \ldots, a_k^N]$ and $a_k^i$ is the ith coordinate of transmitted symbol. We can also use histogram to estimate the conditional PDF when the channel is not Gaussian. We will implement a new method called Monte Carlo integration, instead of numerical integration when estimating the log-likelihood function, which is shown as $$l(\alpha) = \log E_\theta\{\exp[l(\alpha,\theta)]\} \quad (5)$$

where $l(\alpha, \theta)$ is the log-likelihood function for the transmitted symbols and $E_\theta$ is the expectation average.

Figure 2:
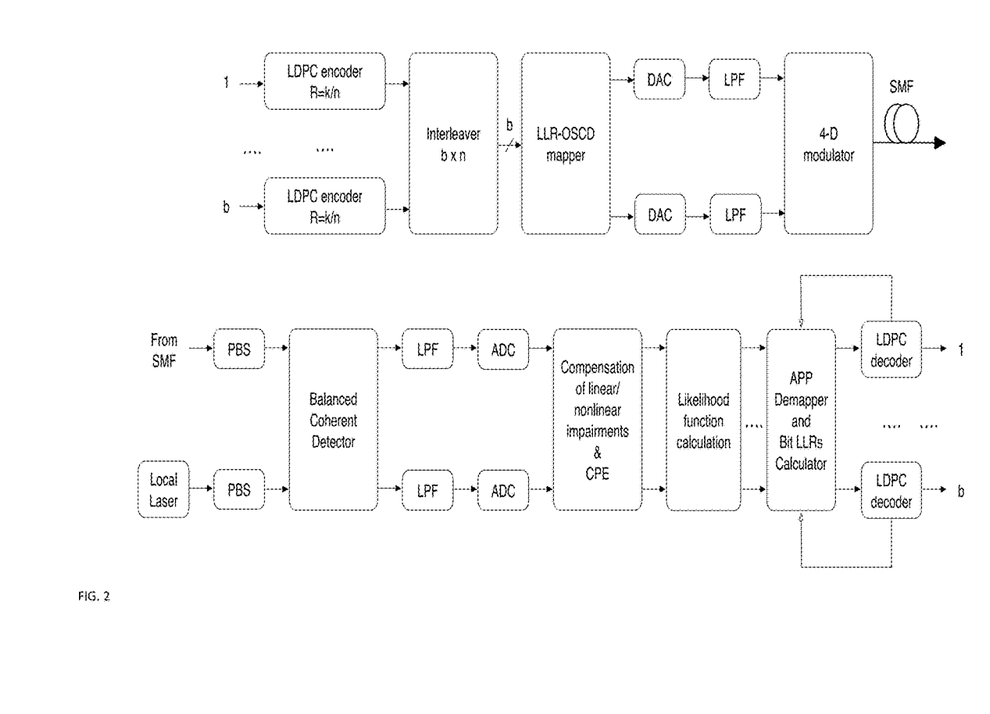
FIG. 2 shows an exemplary LDPC coded modulation scheme with Monte Carlo integration.

The LDPC coded modulation scheme we used in the simulation is shown in the FIG. 2. The b independent data are first encoded by (n,k) LDPC encoder and written in row-wise fashion into b×n block interleaver. Then the LLR-OSCD mapper takes b bits to select a constellation point and 4D modulator will convert the coordinates to optical domain. At the receiver side, the log-likelihood are be calculated by (5), after the coherent detection and CPE. Once the bit LLRs are calculated, the LDPC decoders perform decoding for b bits at the same time. The extrinsic information is then iterated between APP demapper and LDPC decoders. FIG. 2 shows the structure of the scheme for 2D signaling and this scheme is also suitable for 4D transmission.

Nonlinear Phase Noise Model

Our channel model is nonlinear phase noise model with discrete amplification for the finite number of fiber spans.

When the optical signal is periodically amplified by EDFAs, the nonlinear phase noise is unavoidably added to the optical signal and accumulated as the number spans increases. For convenience, we consider the discrete memoryless channel model, which can be described as follows:

$$Y = (X+Z)e^{-j\Phi_{NL}} \quad (1)$$

where $X \in \mathcal{X}$ is the channel input, Z is the total additive noise, and Y is the channel observation. (In (1) j denotes the imaginary unit.) In each fiber span, the overall nonlinear phase shift $\Phi_{NL}$ is given by $$\Phi_{NL} = \int_0^L \gamma P(z) dz = \gamma L_{eff} P \quad (2)$$

where P is the launch power and γ is the nonlinear Kerr-parameter. For a fiber span length of L with attenuation coefficient of α, the power evolution is described as $P(z) = Pe^{-\alpha z}$ and the effective length is defined as $$L_{eff} = \frac{1 - e^{-\alpha L}}{\alpha} \quad (3)$$

For a system with $N_A$ fiber spans, the overall nonlinear phase noise is given by:

$$\Phi_{NL} = \gamma L_{eff} \{|E_0 + n_1|^2 + |E_0 + n_1 + n_2|^2 + \cdots + |E_0 + n_1 + \cdots + n_{N_A}|^2\} \quad (4)$$

where $E_0$ is the baseband representation of the transmitted electric field, $n_k$ is independent identically distributed zero-mean circular Gaussian random complex variable with variance $\delta_0^2$. The total additive noise at the end of all fiber segments has the variance $\delta^2 \triangleq E[Z^2] = 2N_A \delta_0^2$ and can be calculated as $$\delta^2 = 2n_{sp}h\nu\alpha\Delta\nu N_A \quad (5)$$

In this channel model, the variance of the phase noise is dependent on the channel input and the channel is specified by the number of spans, transmission length, and the launch power.

Optimal Signal Constellation Design for the Nonlinear Phase Noise Channel

In the presence of nonlinear phase noise, we can use an algorithm similar to OSCD algorithm but now changing the optimization criterion from minimizing the mean square error to maximizing the cumulative log-likelihood function in order to get the optimal signal constellation. The optimum source distribution for the nonlinear phase noise channel can be obtained by Arimoto-Blahut algorithm and then we can generate the training samples from this source. Then we run our proposed algorithm, which is described below. In this algorithm we perform clustering of the constellation points generated by optimum source based on cumulative log-likelihood function. New constellation points will be then obtained by calculating the center of mass of such obtained clusters. This procedure is repeated until convergence or until a predetermined number of iterations has been reached.

The proposed algorithm, called here nonlinear optimum signal constellation design (NL-OSCD), can be formulated as follows.

0) Initialization step. Choose the signal constellation that will be used for initialization and normalize the power of constellation to target launch power P. (Both QAM and IPQ constellation can be used as initialization.) Let the size of constellation be M.

1) Generate the training sequence from the optimum source distribution. Denote this sequence as $\{x_j; j=0, \ldots, n-1\}$.

2) The clustering step. Group the samples from this sequence into M clusters. The membership to the cluster is determined based on the log-likelihood ratio (LLR) of sample point and candidate signal constellation points from previous iteration. Each sample point is assigned to the cluster with the largest LLR. Given the mth subset (cluster) with N candidate constellation points, denoted as $\hat{A}_m = \{y_i; i=1, \ldots, N\}$, find the log-likelihood (LL) function of partition $P(\hat{A}_m) = \{S_i; i=1, \ldots, N\}$ as follows $$LL_m = LL(\{\hat{A}_m, P(\hat{A}_m)\}) = n^{-1} \sum_{k=0}^{n-1} \max_{y \in \hat{A}_m} LL(x_k, y) \quad (6)$$

The function $LL(x_j, y)$ is the cumulative log-likelihood function defined as $$LL(x_k, y) = \frac{1}{NS} \sum_{i=1}^{NS} -\frac{\{x_{k1} - \text{Re}[(y_1 + y_2 j)e^{-j \times PN_i}]\}^2 +}{2\delta^2} \quad (7)$$

where NS denotes the number of phase noise samples and the corresponding nonlinear phase noise sample is denoted as $PN_i$, which can be generated using the channel model previously described in $x_{k1}$ and $x_{k2}$ denote the first and second coordinates of the constellation point $x_k$. Similarly, $y_1$ and $y_2$ denote the coordinates of the received vector (point) y. The equation above is applicable to two-dimensional (2D) signal constellation designs, but it can straightforwardly be generalized for arbitrary dimensionality.

3) Determine the new signal constellation points as the center of mass for each cluster.

Repeat the steps 2)-3) until convergence.

Figure 3:
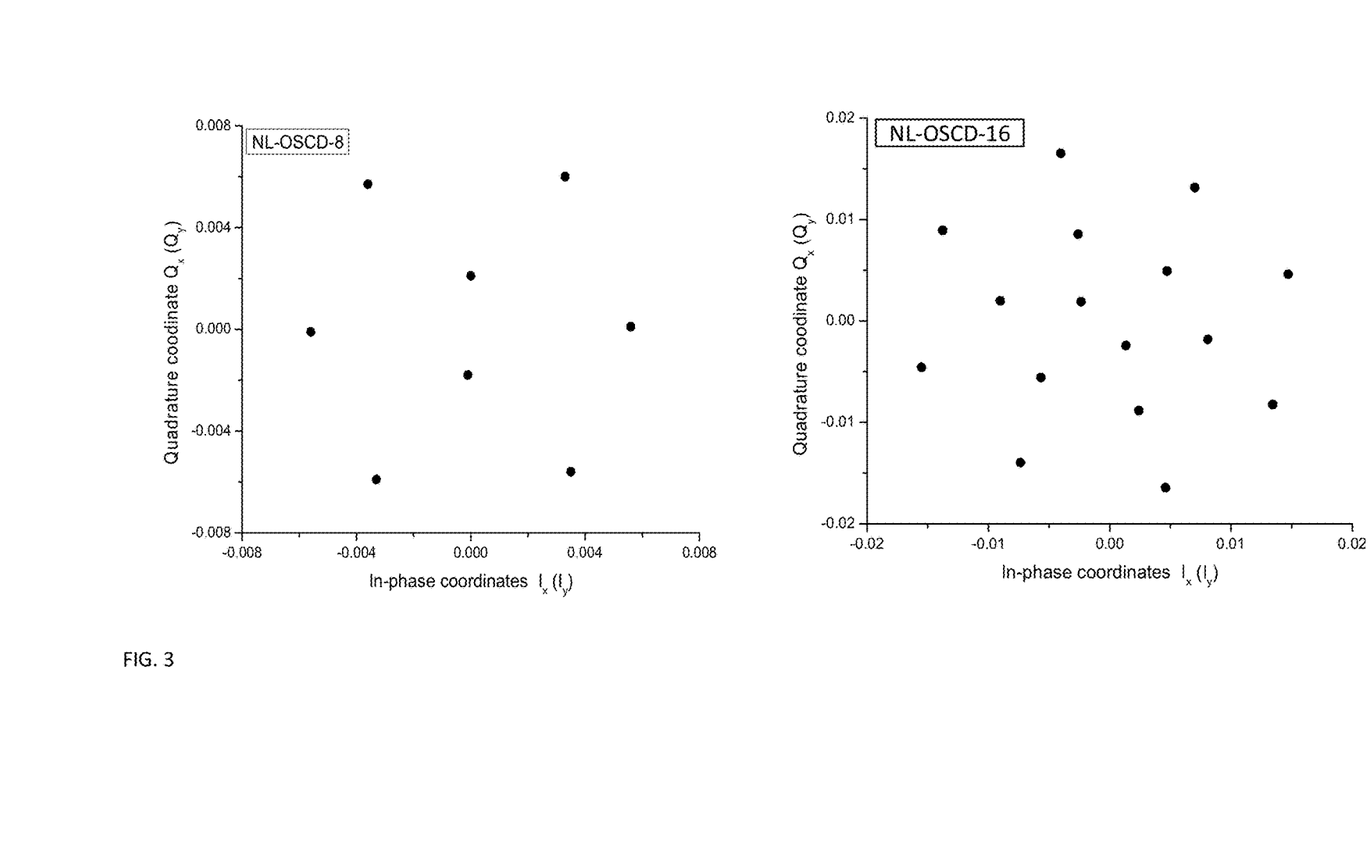
FIG. 3 show exemplary 2D 8-ary and 16-ary constellations for NL-OSCD.

As an illustration, in FIG. 3 we disclose the 2D signal constellations for 8-ary signaling obtained by NL-OSCD (left chart) and for 16-ary signaling obtained by NL-OSCD (right chart).

The signal constellation design method is applicable to coherent detection systems with residual phase error introduced by imperfect carrier phase estimator. Instead of using the Euclidian distance as optimization criterion that is optimum only for additive white Gaussian noise (AWGN) channel, the system defines a cumulative log-likelihood function and use it as an optimization criterion instead. The optimization criterion is applicable to scenarios in which either linear or nonlinear phase noise dominates. The optimum source distribution is obtained by maximizing the channel capacity, based on Arimoto-Blahut algorithm. The process can be considered as a generalization of the optimum signal constellation design (OSCD) method. Since the method uses the cumulative log-likelihood function as the optimization criterion, based on log-likelihood ratio (LLR) calculation, it has been named here LLR-based OSCD (LLR-OSCD) method. We also an LDPC coded modulation scheme suitable for use in combination with constellations obtained by LLR-OSCD method, which is suitable for use in situations when residual phase error is present in receiver. This LDPC coded modulation scheme represents the generalization of scheme. Monte Carlo simulations indicate that the LDPC-coded modulation schemes based on signal constellations obtained by algorithm significantly outperform the corresponding LDPC-coded QAM.

Advantages may include one or more of the following. The optimum signal constellation design algorithm, named LLR-OSCD, is suitable for receiver operating in the presence of residual phase noise. The method employs the cumulative log-likelihood function as an optimization criterion. The method is applicable to both the channels with linear and nonlinear phase noise, and can easily be generalized to other channels. The LDPC-coded constellations show better robustness to the residual phase noise compared to the conventional QAM-based schemes. The code-modulation scheme, employing signal constellations from LLR-OSCD/NL-OSCD, is robust to laser phase noise, imperfect CPE, and nonlinear phase noise introduced by fiber nonlinearities. The method is robust to cyclic slips. The Monte Carlo integration method to use to calculate the symbol likelihoods in the presence of residual phase error. The method is applicable to both 2-D and multidimensional signaling schemes. The optimized modulation schemes, when used in combination with LDPC coding, are more robust in the presence of phase error than conventional LDPC-coded QAM. The method can also be used in both SMF and FMF applications.

Figure 4:
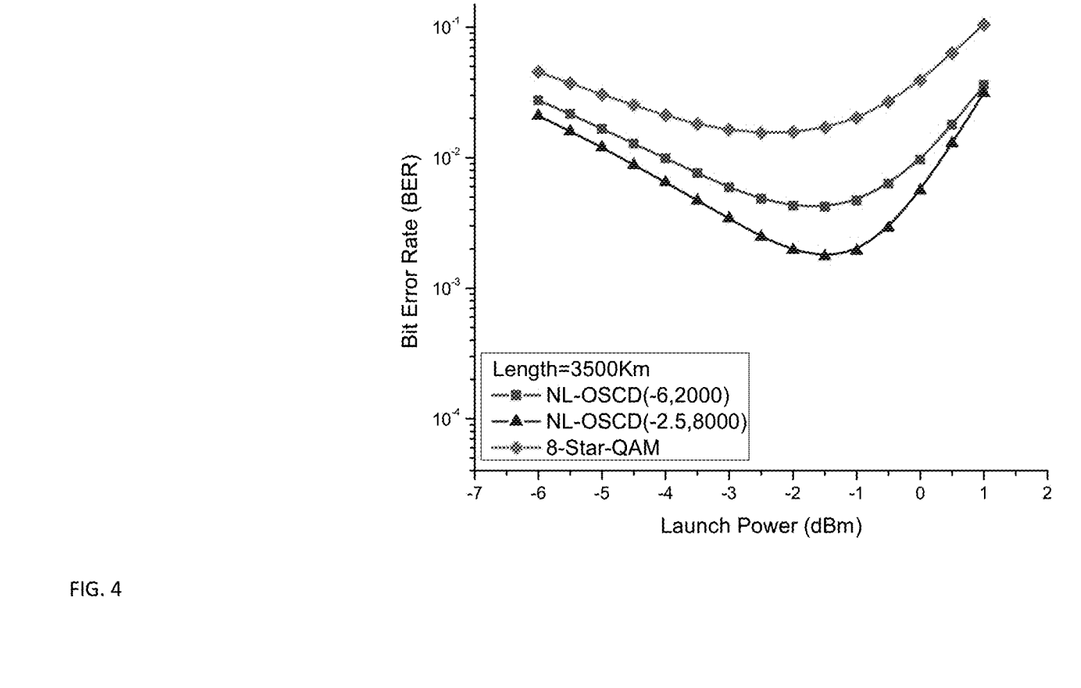
FIG. 4 Uncoded BER vs. launch power for 8-ary NL-OSCD and 8-QAM.
Figure 5:
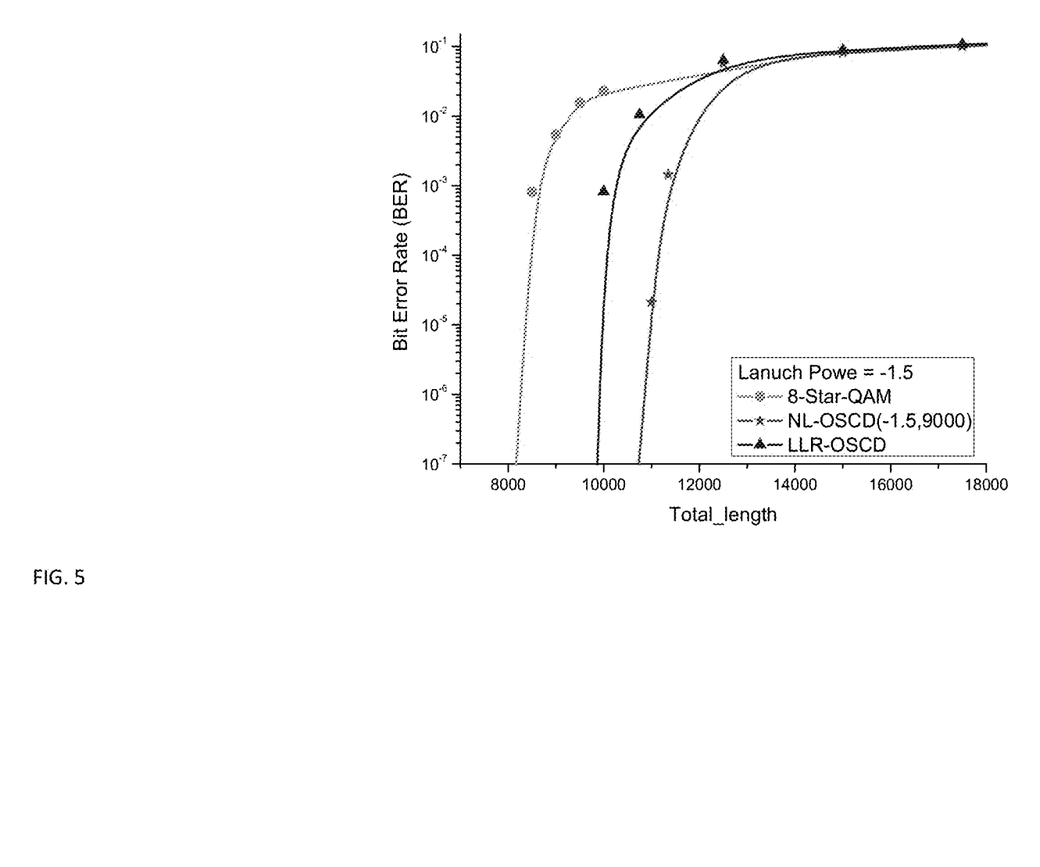
FIG. 5 LDPC-coded BER vs. total transmission distance 8-ary NL-OSCD and 8-QAM.

As an illustration, in FIGS. 4-5 we provide the results obtained by NL-OSCD method for 8-ary NL-OSCD, for optimized amplifier spacing, corresponding to aggregate data rate 2×25 Gs/s×3=150 Gb/s per single-carrier. The FIG. 4 clearly indicates the existence of the optimal launch power for total transmission distance of 3500 km for both 8-ary NL-OSCD and 8-QAM. It can also be noticed that the nonlinear tolerance of 8-NL-OSCD is better. NL-OSCD (−6, 2000) curve denotes that this constellation has been obtained by employing NL-OSCD with the launch power of −6 dBm and for total transmission distance of 2000 km. We can see that NL-OSCDs with different parameters have similar optimal power around −1.5 dBm. The total transmission distance that can be achieved by employing NL-OSCDs and LDPC coding is around 9000 km, as shown in FIG. 5. After running the NL-OSCD algorithm for the launch power of −1.5 dBm and total transmission distance of 9000 km, the transmission distance can be extended to close to 11000 km. Notice that this result is obtained without NL compensation. This initial study will be extended to larger constellation sizes.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) was chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally and equitably entitled.

What is claimed is:

1. A signal constellation design method to enable transmission over coherent optical channels with nonlinear phase noise, comprising:
   with a processor, splitting a received training sequence of data into clusters of points according to a cumulative log-likelihood function from constellation obtained in a previous iteration;
   generating new constellation points by calculating a center of mass of the clusters of points;
   repeating until convergence or until a predetermined number of iterations has been reached to determine a signal constellation; and
   transmitting signals over the coherent optical channels with nonlinear phase noise using the signal constellation such designed to communicate data over an optical fiber and wherein the transmitted signal is coherently detected by a receiver.

2. The method of claim 1, comprising estimating a log-likelihood function:

$$l(\alpha) = \log E_{\Phi_{NL}}\{\exp[l(\alpha, \Phi_{NL})]\}$$

where $l(\alpha, \Phi_{NL})$ is a log-likelihood function for transmitted symbols and $E_{\Phi_{NL}}$ is an expectation average over a nonlinear phase $\Phi_{NL}$.

3. The method of claim 1, comprising calculating log-likelihood after coherent detection and carrier phase estimation (CPE).

4. The method of claim 1, comprising decoding for b data LDPC coded streams at the same time and iterating extrinsic information between an APP demapper and LDPC decoders.

5. The method of claim 1, comprising encoding b independent data by an (n,k) LDPC encoder and writing in row-wise fashion into a b×n block interleaver.

6. The method of claim 1, comprising performing Monte Carlo integration at a receiver.

7. The method of claim 1, comprising optimum source distribution used in the algorithm is generated by maximizing the channel capacity based on Arimoto-Blahut method.

8. The method of claim 1, comprising applying a function $LL(x_j, y)$ as a cumulative log-likelihood function defined as $$LL(x_k, y) = \frac{1}{NS} \sum_{i=1}^{NS} -\frac{\{x_{k1} - \text{Re}[(y_1 + y_2 j)e^{-j \times PN_i}]\}^2 + \{x_{k2} - \text{Im}[(y_1 + y_2 j)e^{-j \times PN_i}]\}^2}{2\delta^2}$$

where NS denotes a number of phase noise samples and a corresponding phase noise sample is denoted as $PN_i$, $x_{k1}$ and $x_{k2}$ denote first and second coordinates of point $x_k$, $y_1$ and $y_2$ denote coordinates of the point y.

9. The method of claim 1, comprising find the likelihood function (LL) of partition $P(\hat{A}_m) = \{S_i; i=1, \ldots, N\}$, as $$LL_m = LL(\{\hat{A}_m, P(\hat{A}_m)\}) = n^{-1} \sum_{k=0}^{n-1} \max_{y \in \hat{A}_m} LL(x_k, y).$$

10. A method to design signal constellation for transmission over coherent optical channels with nonlinear phase noise, comprising:
   selecting a signal constellation to be used for initialization, wherein M is a size of the constellation;

generating a training sequence from an optimum source distribution as $\{x_j; j=0, \ldots, n-1\}$;

grouping samples from the training sequence into M clusters;

determining membership to the cluster based on LLR of sample point and candidate signal constellation points from a previous iteration;

assigning each sample point to the cluster with the largest LLR;

determining new signal constellation points as center of mass for each cluster; repeating until convergence; and transmitting signals over the coherent optical channels with nonlinear phase noise using the signal constellation such designed to communicate data over an optical fiber, wherein the transmitted signal is coherently detected by a receiver.

11. The method of claim 10, comprising given the m-th subset (cluster) with N candidate constellation points, denoted as $\hat{A}_m = \{y_i; i=1, \ldots, N\}$, finding a likelihood function of partition $P(\hat{A}_m) = \{S_i; i=1, \ldots, N\}$, as $$LL_m = LL(\{\hat{A}_m, P(\hat{A}_m)\}) = n^{-1} \sum_{k=0}^{n-1} \max_{y \in \hat{A}_m} LL(x_k, y).$$

12. The method of claim 10, comprising generating a function $LL(x_j,y)$ is the cumulative log-likelihood function defined as $$LL(x_k, y) = \frac{1}{NS} \sum_{i=1}^{NS} -\frac{\{x_{k1} - \text{Re}[(y_1 + y_2 j)e^{-j \times PN_i}]\}^2 + \{x_{k2} - \text{Im}[(y_1 + y_2 j)e^{-j \times PN_i}]\}^2}{2\delta^2}$$

where NS denotes a number of phase noise samples and a corresponding phase noise sample is denoted as $PN_i \cdot x_{k1}$ and $x_{k2}$ denote first and second coordinates of point $x_k$, $y_1$ and $y_2$ denote coordinates of the point y.

13. The method of claim 1, comprising finding a maximum of cumulative log-likelihood function as an optimization criterion.

14. The method of claim 1, comprising the channels with linear and nonlinear phase noise.

15. The method of claim 1, comprising employing LDPC-coded-modulation using signal constellations from LLR-OSCD.

16. The method of claim 1, comprising communicating over channel dominated by laser phase noise, imperfect CPE, and nonlinear phase noise introduced by fiber nonlinearities.

17. The method of claim 1, comprising encoding b independent data by an (n,k) LDPC encoder and writing in row-wise fashion into a b×n block interleaver.

18. The method of claim 1, comprising performing Monte Carlo integration at a receiver.

19. The method of claim 1, comprising generating an optimum source by maximizing channel capacity based on Arimoto-Blahut method.

* * * * *